United States Patent
Fujiya et al.

(10) Patent No.: US 7,733,648 B2
(45) Date of Patent: Jun. 8, 2010

(54) ELECTRONIC APPARATUS

(75) Inventors: Hiromitsu Fujiya, Kawasaki (JP);
Hideki Kimura, Kawasaki (JP); Eiji Makabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/073,930

(22) Filed: Mar. 12, 2008

(65) Prior Publication Data

US 2008/0225496 A1     Sep. 18, 2008

Related U.S. Application Data

(62) Division of application No. 11/387,762, filed on Mar. 24, 2006, now Pat. No. 7,365,976.

(51) Int. Cl.
*H05K 7/20* (2006.01)

(52) U.S. Cl. ............. 361/695; 361/679.48; 361/679.49; 361/690; 361/693; 361/727; 454/184

(58) Field of Classification Search ............... 361/687, 361/690–697, 703, 714–727, 831; 165/121–127, 165/185; 454/184; 312/223.2, 223.3, 236, 312/265.5; 174/35 R, 35 MS, 51.2, 52.1
See application file for complete search history.

(56) References Cited

U.S. PATENT DOCUMENTS

| | | | |
|---|---|---|---|
| 3,626,251 A * | 12/1971 | Vigue | 361/695 |
| 3,648,113 A * | 3/1972 | Rathjen et al. | 361/707 |
| 4,186,422 A * | 1/1980 | Laermer | 361/689 |
| 4,214,706 A * | 7/1980 | Gee et al. | 239/553.3 |
| 4,489,363 A | 12/1984 | Goldberg | 361/383 |
| 4,894,749 A * | 1/1990 | Elko et al. | 361/690 |
| 5,428,503 A * | 6/1995 | Matsushima et al. | 361/695 |
| 5,493,474 A * | 2/1996 | Schkrohowsky et al. | 361/695 |
| 5,663,868 A * | 9/1997 | Stalley | 361/695 |
| 5,999,403 A | 12/1999 | Neustadt | 361/695 |
| 6,151,210 A * | 11/2000 | Cercioglu et al. | 361/690 |
| 6,459,579 B1 * | 10/2002 | Farmer et al. | 361/695 |
| 6,611,428 B1 * | 8/2003 | Wong | 361/695 |
| 6,628,520 B2 * | 9/2003 | Patel et al. | 361/696 |
| 6,822,859 B2 | 11/2004 | Coglitore et al. | 361/687 |
| 6,904,968 B2 * | 6/2005 | Beitelmal et al. | 165/247 |
| 6,927,980 B2 | 8/2005 | Fukuda et al. | 361/700 |
| 6,987,673 B1 | 1/2006 | French et al. | 361/727 |
| 7,046,513 B2 | 5/2006 | Nishiyama et al. | 361/695 |

(Continued)

FOREIGN PATENT DOCUMENTS

JP     406077680 A *     3/1994

(Continued)

*Primary Examiner*—Michael V Datskovskiy
(74) *Attorney, Agent, or Firm*—Kratz, Quintos & Hanson, LLP

(57) ABSTRACT

A first printed wiring board extends in the vertical direction within a first duct that extends in the vertical direction. A first axial flow fan generates airflow which absorbs heat from the first printed wiring board. Second and third ducts extends in parallel with the first duct. A fourth duct extends between the second and third ducts. A second printed wiring board extends in the horizontal direction within the fourth duct. A second axial flow fan is connected to the third duct. The second axial flow fan generates airflow which absorbs heat from the second printed wiring board. The electronic apparatus can be reduced in size.

3 Claims, 11 Drawing Sheets

U.S. PATENT DOCUMENTS

| | | | |
|---|---|---|---|
| 7,152,412 B2 | 12/2006 | Alappat et al. | 62/186 |
| 7,154,748 B2 | 12/2006 | Yamada | 361/690 |
| 7,183,500 B2 | 2/2007 | Campini et al. | 27/7 |
| 7,187,547 B1 | 3/2007 | French et al. | 361/687 |
| 7,254,022 B2 | 8/2007 | Ebermann | 361/696 |
| 7,262,962 B1 | 8/2007 | McLeod et al. | 361/687 |

FOREIGN PATENT DOCUMENTS

| | | |
|---|---|---|
| JP | 2004-55883 | 2/2004 |

* cited by examiner

ELECTRONIC APPARATUS

This application is a Divisional of prior application Ser. No. 11/387,762 filed on Mar. 24, 2006 now U.S. Pat. No. 7,365,976, the contents being incorporated herein by reference

BACKGROUND OF THE INVENTION

1. Field of the Invention

The present invention relates to an electronic apparatus such as a server computer.

2. Description of the Prior Art

A system board unit is incorporated in a server computer. The system board unit includes a printed circuit board unit kept in an upright attitude. The printed circuit board unit is placed in a duct extending in the vertical direction. The air outlet of the system board unit is opposed to an axial flow fan rotating around the vertical axis. Airflow runs in the vertical direction in response to the rotation of the rotor in the axial flow fan.

An electronic component unit serving as a crossbar switch is incorporated in the server computer, for example. The electronic component unit includes a printed circuit board unit kept in a horizontal attitude. The printed circuit board unit is incorporated in a duct extending in the horizontal direction. The air outlet of the electronic component unit is opposed to an axial flow fan having a rotor rotating around the horizontal axis. Airflow runs in the horizontal direction in response to the rotation of the rotor in axial flow fan.

The server computer includes the axial flow fan rotating around the vertical axis and the axial flow fan rotating around the horizontal axis for cooling the printed circuit board units. These axial flow fans respectively occupy larger spaces in the vertical and horizontal directions within the server computer. The server computer inevitably gets larger in size.

SUMMARY OF THE INVENTION

It is accordingly an object of the present invention to provide an electronic apparatus capable of enjoying a reduced size without preventing an efficient airflow therein.

According to a first aspect of the present invention, there is provided an electronic apparatus comprising: an enclosure; a first duct defined in the enclosure, the first duct extending in the vertical direction; a first printed wiring board or boards extending in the vertical direction within the first duct; a first axial flow fan placed within the first duct, the first axial flow fan including a rotor rotating around the vertical axis; second and third ducts defined in the enclosure in parallel with the first duct; a fourth duct extending in the horizontal direction at least between the second and third ducts; a second printed wiring board extending in the horizontal direction within the fourth duct; and a second axial flow fan connected at least to the third duct, the second axial flow fan including a rotor rotating around the vertical axis.

The electronic apparatus allows airflow to run in the vertical direction within the first duct with the assistance of the first axial flow fan. The airflow absorbs heat from the first printed wiring board. The first printed wiring board is thus cooled down. Airflow is also allowed to run in the horizontal direction within the fourth duct with the assistance of the second axial flow fan. The airflow absorbs heat from the second printed wiring board. The second printed wiring board is thus cooled down. A superior airflow is realized in the enclosure. Moreover, airflow is only allowed to flow into the fourth duct in the vertical direction. The enclosure or electronic apparatus is thus allowed to have a reduced extend in the horizontal direction as compared with the case where an axial flow fan having a rotor rotating around a horizontal axis is utilized to introduce airflow into the fourth duct in the horizontal direction. The electronic apparatus is in this manner allowed to enjoy a reduction in size.

The first and second axial flow fans may be arranged along a common horizontal plane in the electronic apparatus. The first and second axial flow fans can be placed in a packed manner in a predetermined space in the enclosure. The second printed wiring board may intersect the first printed wiring boards. The second printed wiring board may serve to establish an electric connection between the first printed wiring boards.

According to a second aspect of the present invention, there is provided an electronic apparatus comprising: an enclosure; first and second ducts defined in the enclosure, the first and second ducts extending in a first direction; a printed wiring board or boards extending in a second direction perpendicular to the first direction between the first and second ducts; and an axial flow fan or fans connected to at least one of the first and second ducts, the axial flow fan or fans each having a rotor rotating around the rotation axis extending in the first direction.

The electronic apparatus allows airflow to run in the first direction with the assistance of the rotor or rotors of the axial flow fan or fans. The air flow runs in the second direction along the surface or surfaces of the printed wiring board or boards. The airflow absorbs heat from the printed wiring board or boards. The printed wiring board or boards are thus cooled down. In this case, such air flow is directed toward the surface or surfaces of the printed wiring board or boards in the first direction. The enclosure or electronic apparatus is thus allowed to have a reduced extend in the horizontal direction as compared with the case where an axial flow fan having a rotor rotating around a horizontal axis is utilized to direct airflow toward the printed wiring board or boards in the horizontal direction. The electronic apparatus is in this manner allowed to enjoy a reduction in size.

The electronic apparatus may further comprise: a third duct extending between the first and second ducts along a first printed wiring board selected from the printed wiring boards; and a fourth duct extending between the first and second ducts along a second printed wiring board selected from the printed wiring boards at a position downstream of the third duct, the fourth duct having a pressure loss larger than the pressure loss of the third duct.

The larger pressure loss of the fourth duct causes a reduction in the amount of airflow introduced into the fourth duct. This results in an increase in the amount of airflow introduced into the third duct at a position upstream of the fourth duct. The amount of airflow can thus be equalized between the third and fourth ducts. A superior airflow can be realized in all the first to fourth ducts.

The fourth duct may be designed to define an air passage at least partly narrower than an air passage defined in the third duct. When the air passage defined in the fourth duct is at least partly narrower than the air passage defined in the third duct, the pressure loss of the fourth duct can be set larger than that of the third duct.

Likewise, an opening defined between the fourth and first ducts may be narrower than an opening defined between the third and first ducts. When the opening defined between the fourth and first ducts is narrower than the opening defined between the third and first ducts, the pressure loss of the fourth duct can be set larger than that of the third duct.

A specific electronic component unit may be employed to realize the aforementioned electronic apparatus. The electronic component unit may comprise: a printed wiring board; an electronic component mounted on the surface of the printed wiring board; a duct lying adjacent to the outer periphery of the printed wiring board at a position outside the printed wiring board, the duct extending in a direction perpendicular to the surface of the printed wiring board; and an opening formed in the duct along the surface of the printed wiring board.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
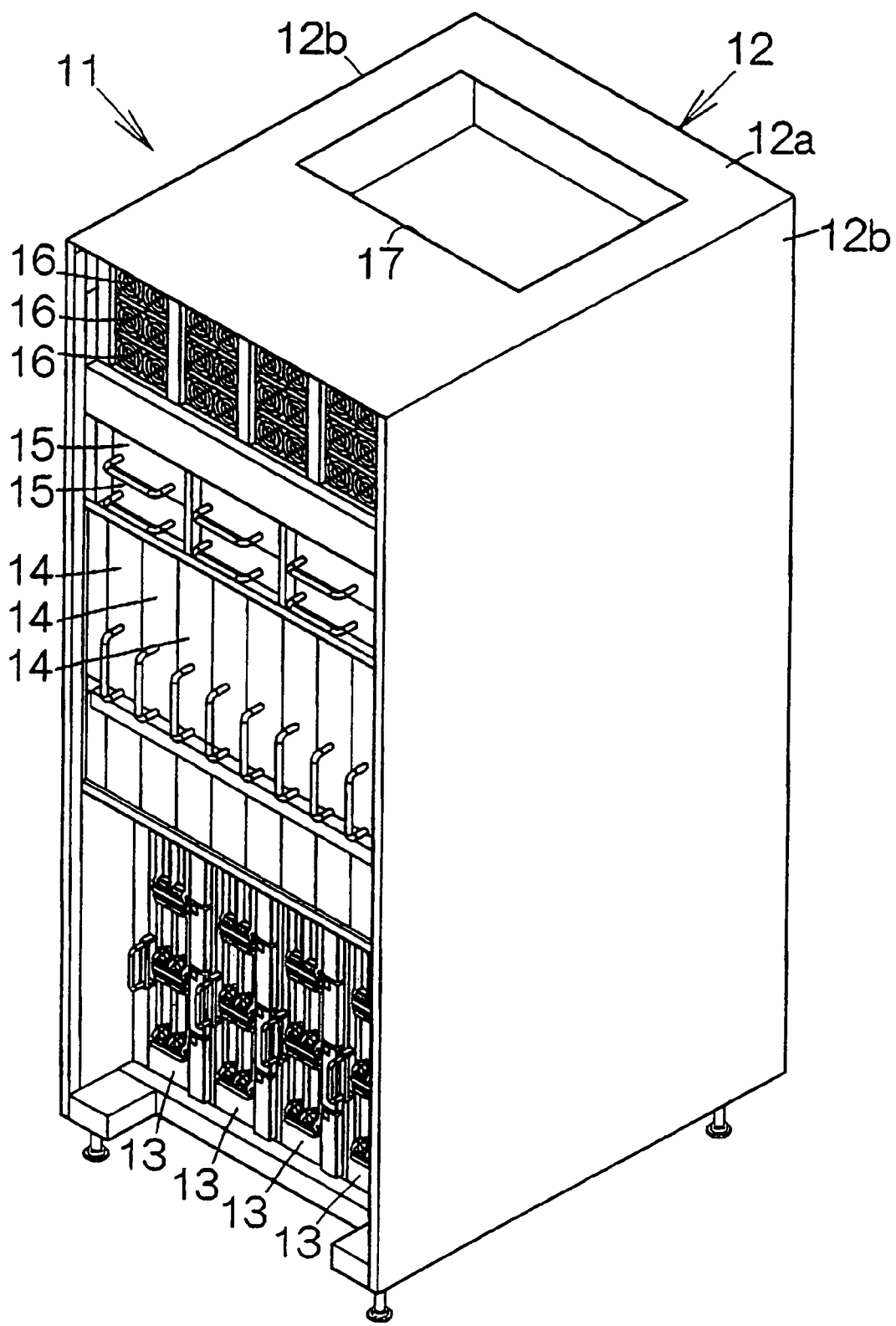
FIG. 1 is a perspective view from the front side schematically illustrating a server computer as a specific example of an electronic apparatus according to an embodiment of the present invention.

FIG. 1 schematically illustrates a server computer 11 as a specific example of an electronic apparatus according to an embodiment of the present invention. The server computer 11 includes an enclosure 12. Input/output units 13 are mounted on the lower rack of the enclosure 12 at the foreside of the enclosure 12. The input/output units 13 are kept in upright attitudes in the vertical direction perpendicular to the floor. A PCI board is incorporated in the individual input/output unit 13, for example. A LAN cable is coupled to the PCI board, for example.

System board units 14 are mounted on the middle rack of the enclosure 12. The system board units 14 are kept in upright attitudes in the vertical direction. A system board is incorporated in the individual system board unit 14. The system board includes electronic circuit elements such as a central processing unit (CPU), a memory, and the like, mounted on a printed wiring board, for example. The CPU executes various kinds of processing based on software programs and/or data temporarily stored in the memory, for example.

First fan units 15 are mounted on the upper rack of the enclosure 12, for example. The individual first fan unit 15 includes first axial flow fans as described later in detail. The first axial flow fans serve to generate airflow running in the vertical direction from the bottom of the enclosure 12 toward the top of the enclosure 12.

Power source units 16 are mounted on the uppermost rack of the enclosure 12. The power source units 16 serve to transform the alternating current supplied from an outlet into the direct current. The direct current is supplied to the first fan units 15 and a back panel placed within the enclosure 12.

The enclosure 12 includes a panel at the top of the enclosure 12, namely a top panel 12a, extending in the horizontal direction parallel to the floor. An air discharge opening 17 is formed in the top panel 12a. The enclosure 12 also includes panels at the opposite sides of the enclosure 12, namely side panels 12b, extending in the vertical direction, respectively.

Figure 2:
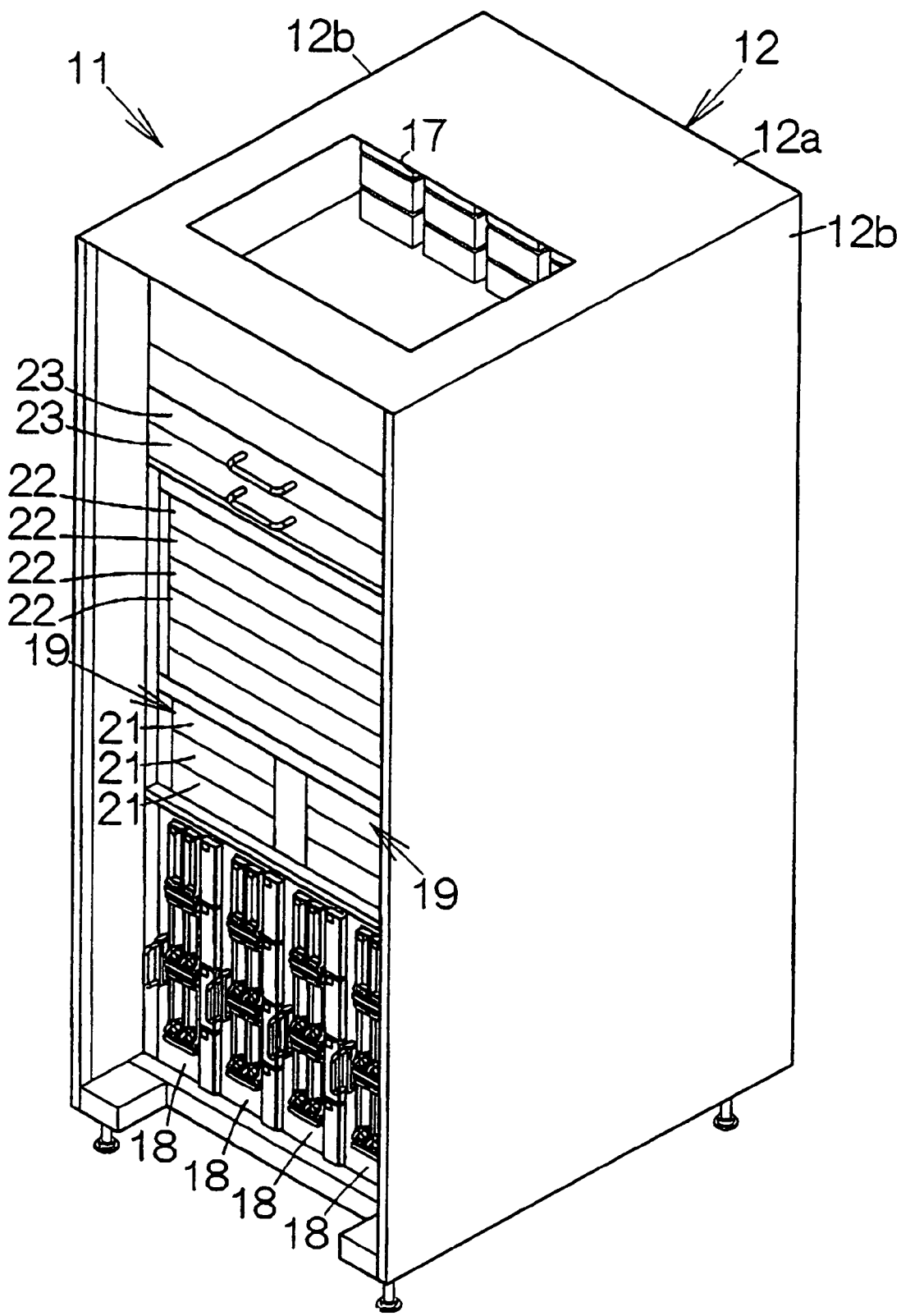
FIG. 2 is a perspective view from the rear side schematically illustrating the sever computer.

As shown in FIG. 2, input/output units 18 are mounted on the lower rack of the enclosure 12 at the backside of the enclosure 12. The input/output units 18 are kept in upright attitudes in the vertical direction perpendicular to the floor. A PCI board is incorporated in the individual input/output unit 18 in the same manner as the aforementioned input/output unit 13. A LAN cable is coupled to the PCI board, for example.

A pair of first electronic component unit sets 19, 19 are for example mounted on the middle rack of the enclosure 12 on the backside of the enclosure 12. The individual first electronic component unit set 19 includes first electronic component units 21, 21, 21 arranged in three tiers in the vertical direction, for example. The first electronic component units 21 are kept in horizontal attitudes. Description will be made on the first electronic component units 21 later in detail.

Second electronic component units 22 are mounted on the middle rack of the enclosure 12 at the backside of the enclosure 12. The second electronic component units 22 are arranged in six tiers in the vertical direction, for example. The second electronic component units 22 are kept in horizontal attitudes. Description will be made on the second electronic component units 22 later in detail.

Second fan units 23,23 are mounted on the upper rack of the enclosure 12 on the backside of the enclosure 12. The individual second fan unit 23 includes second axial flow fans, for example, as described later in detail. The second axial flow fan units 23 serve to generate airflow running in the vertical direction from the bottom of the enclosure 12 toward the top of the enclosure 12.

Figure 3:
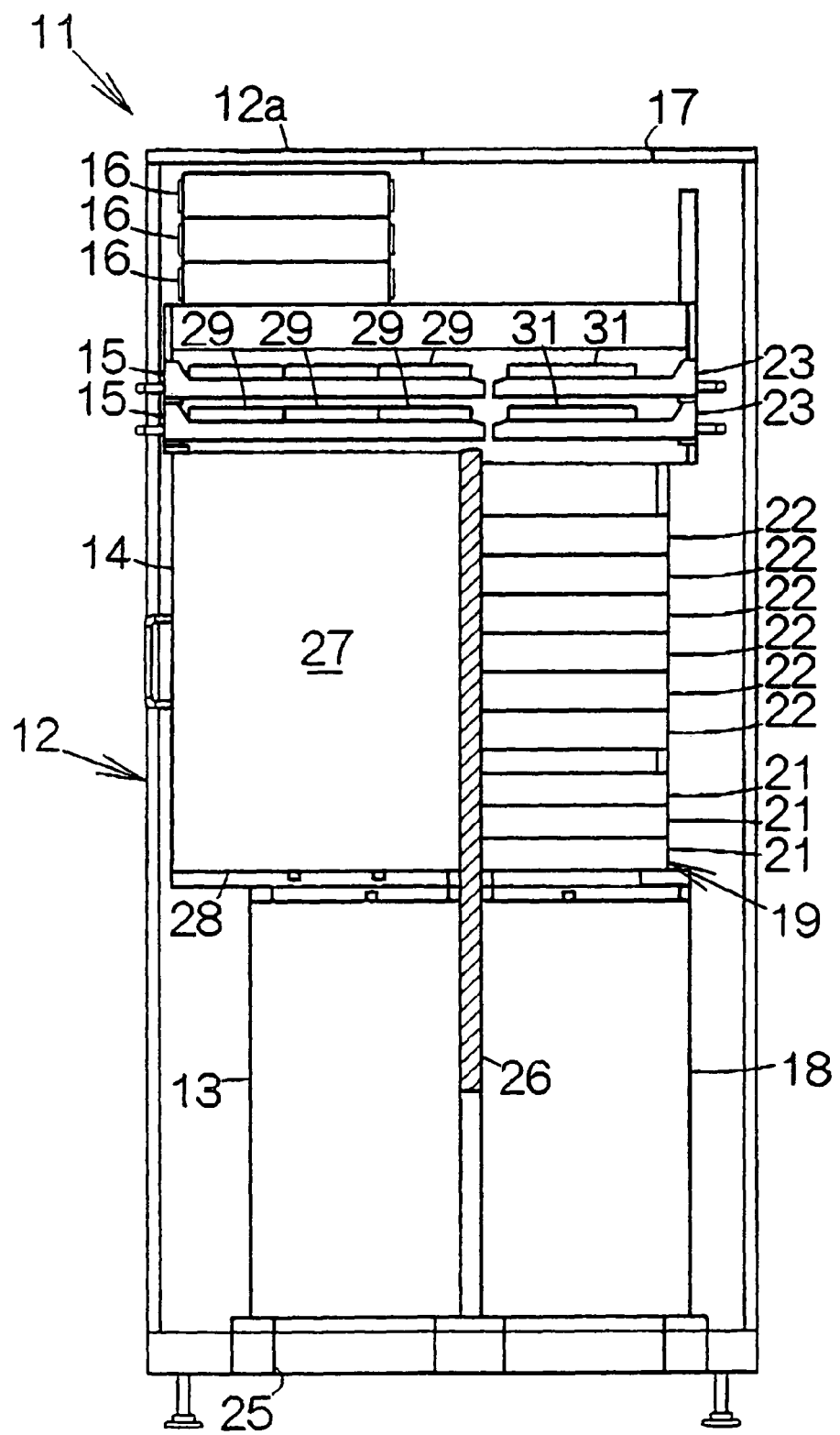
FIG. 3 is a sectional view schematically illustrating the inner structure of the server computer.

As shown in FIG. 3, an air intake opening 25 is defined in the bottom of the enclosure 12. The air intake opening 25 is opposed to the floor. A fresh air is introduced into the inner space of the enclosure 12 through the air intake opening 25. The back panel 26 is placed in the inner space of the enclosure 12. The back panel 26 stands upright in the vertical direction. The input/output units 13 and the system board units 14 are coupled to the front surface of the back panel 26. The input/output units 18 and the first and second electronic component units 21, 22 are coupled to the back surface of the back panel 26.

A duct 27 is defined between the back panel 26 and the front panels of the input/output units 13 as well as between the back panel 26 and the front panels of the system board units 14 in a space between the side panels 12b, 12b. The duct 27 extends in the vertical direction from the air intake opening 25 to the first fan units 15. The first fan units 15 are thus placed at the end of the duct 27.

The individual system board unit 14 includes a system board 28 extending in the vertical direction within the duct 27.

The system boards 28 are kept in attitude upright to the back panel 26 in the system board units 14, respectively. The system boards 28 are arranged in parallel with one another.

The individual first fan unit 15 includes first axial flow fans 29. The individual first axial flow fan 29 includes a rotor rotating around the vertical axis perpendicular to the floor. The rotation of the rotor generates airflow running in the vertical direction through the duct 27. The airflow absorbs heat from the electronic circuit elements on the PCI boards and the system boards 28. The airflow is discharged through the air discharge opening 17.

The individual second fan unit 23 includes second axial flow fans 31. The first and second axial flow fans 29, 31 are arranged along common horizontal planes. The individual second axial flow fan 31 includes a rotor rotating around the vertical axis perpendicular to the floor. The rotation of the rotor generates airflow running from the air intake opening 25 toward the air discharge opening 17.

Figure 4:
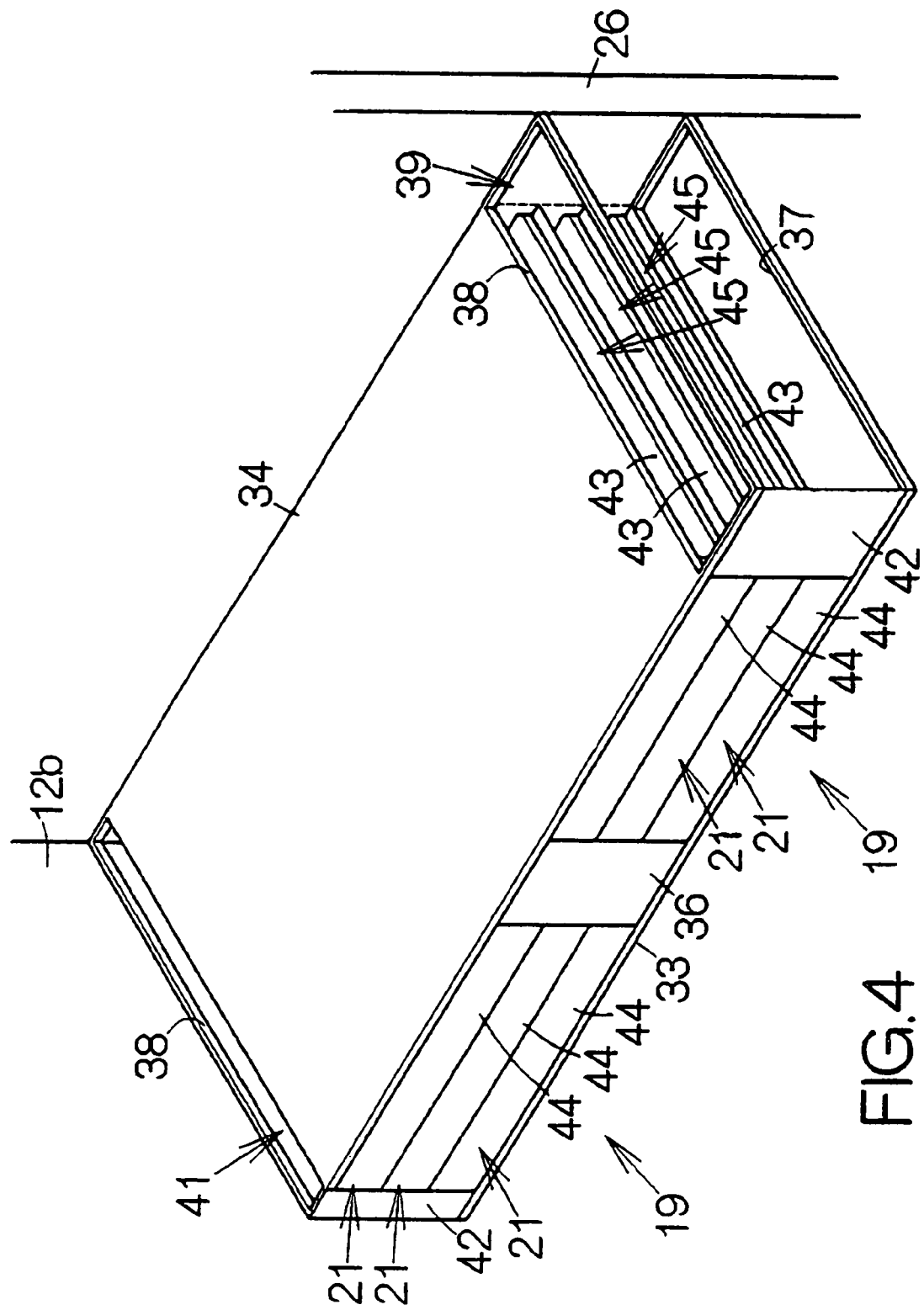
FIG. 4 is a perspective view schematically illustrating the structure of a first electronic component unit.

FIG. 4 schematically illustrates the first electronic component unit sets 19 placed within the server computer 11. As shown in FIG. 4, the first electronic component unit sets 19, 19 are placed in a space between first and second partition boards 33, 34 extending in the horizontal direction. The first partition board 33 supports the first electronic component unit sets 19, 19. The second partition board 34 covers over the first electronic component unit sets 19, 19. The first partition board 33 is opposed to the upper ends of the input/output units 18. The second partition board 34 is opposed to the lowest one of the second electronic component units 22.

An opening, not shown, is defined in the first partition board 33 between the first electronic component unit sets 19, 19. A space extends in the vertical direction from the opening to the second partition board 34. This space functions as a central duct. The central duct is defined between the back panel 26 and a wall member 36. The wall member 36 extends from the front edge of the first partition board 33 to the front edge of the second partition board 34 in a space between the first electronic component unit sets 19, 19. The central duct extends in parallel with the duct 27 in the enclosure 12.

Air inlets 37 are formed in the first partition board 33 between the outer peripheries of the first electronic component unit sets 19 and the corresponding side panels 12b, respectively. Likewise, air outlets 38 are formed in the second partition board 34 between the outer peripheries of the first electronic component unit sets 19 and the corresponding side panels 12b, respectively. Right and left ducts 39, 41 are defined between the first electronic component unit sets 19 and the corresponding side panels 12b, respectively. The right and left ducts 39, 41 extend in the vertical direction from the air inlets 37 to the air outlets 38, respectively. The right and left ducts 39, 41 extend in parallel with the aforementioned duct 27.

The side panels 12b, the back panel 26 and the wall members 42 in combination serve to define the right and left ducts 39, 41. The wall members 42 extend from the front edge of the first partition board 33 to the front edge of the second partition board 34 in a space between the first electronic component unit sets 19 and the corresponding side panels 12b. Here, the right duct 39 has the air inlet 37 and the air outlet 38 larger than the air inlet 37 and the air outlet 38 of the left duct 41, respectively. Specifically, the air passage of the right duct 39 is set thicker than that of the left duct 41.

The individual first electronic component unit 21 includes a printed wiring board 43 in the shape of a rectangle extending in the horizontal direction. The rear edge of the printed wiring board 43 is coupled to the back panel 26 at one of the sides of the rectangle. A front panel 44 stands upright in the vertical direction from the printed wiring board 43 at the front edge of the printed wiring board 43. A horizontal duct 45 is defined between the front panel 44 and the back panel 26 in a space between the adjacent ones of the printed wiring boards 43. It should be noted that the uppermost one of the horizontal ducts 45 is defined between the printed wiring board 43 and the second partition board 34.

Figure 5:
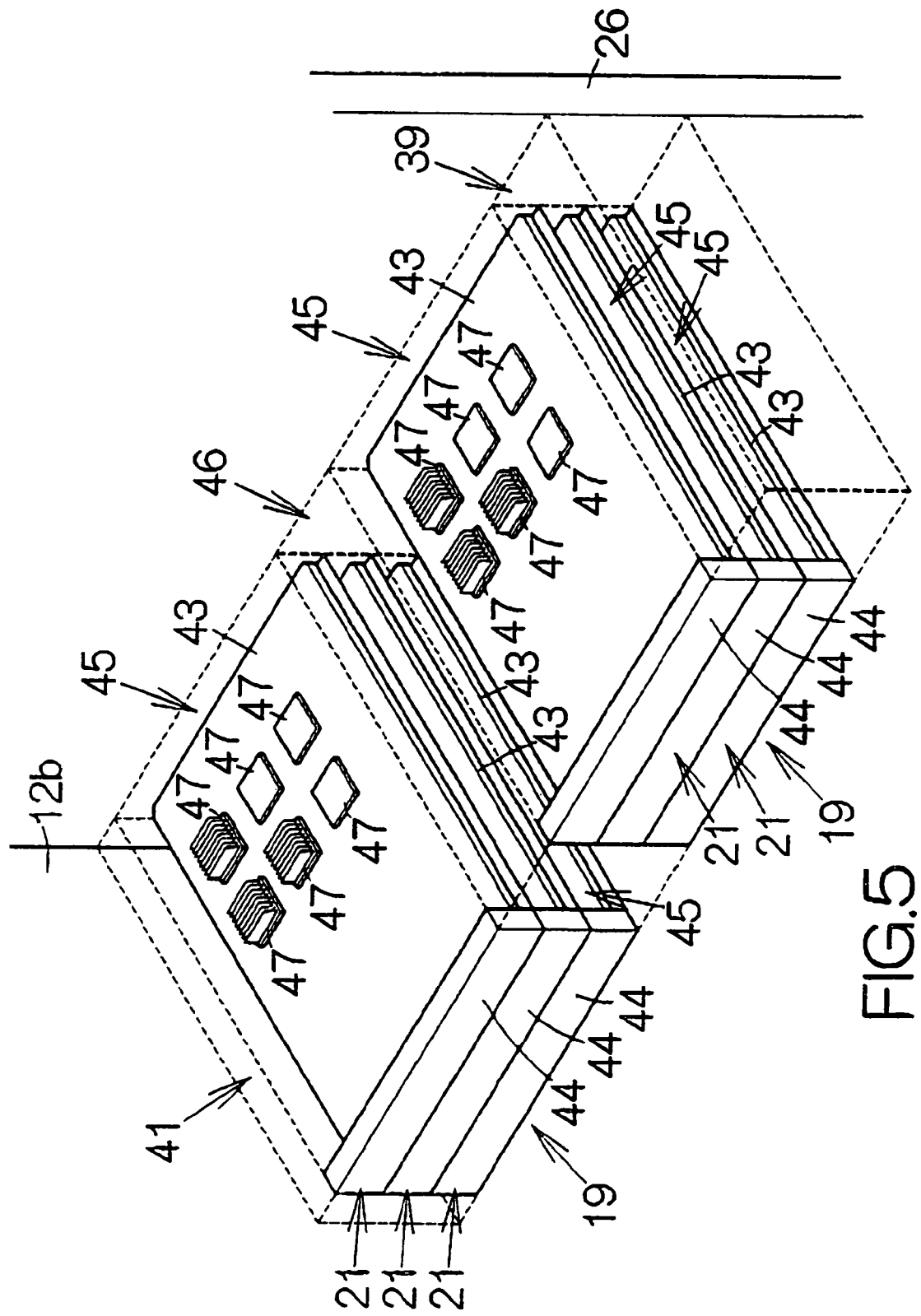
FIG. 5 is a perspective view schematically illustrating the structure of the first electronic component unit without first and second partition boards.

Referring also to FIG. 5, the horizontal ducts 45 extend in the horizontal direction between the central duct 46 and the right duct 39 as well as between the central duct 46 and the left duct 41. The horizontal ducts 45 serve to connect the central duct 46 to the right and left ducts 39, 41, respectively. Electronic components such as large-scale integrated circuit (LSI) packages 47, a memory, and the like, are mounted on the individual printed wiring board 43. A central processing unit (CPU) chip is incorporated in the individual LSI package 47, for example. The CPU executes various kinds of processing based on software programs and/or data temporarily stored in the memory, for example. A cooling fin may be mounted on the individual electronic component, for example. The fin may extend in parallel with the back panel 26 in an upright attitude, for example.

The first electronic component units 21 are utilized for system management of the server computer 11, for example. A LAN cable is coupled to the individual first electronic component unit 21, for example. A personal computer can be coupled to the server computer 11 through the LAN cable, for example.

Figure 6:
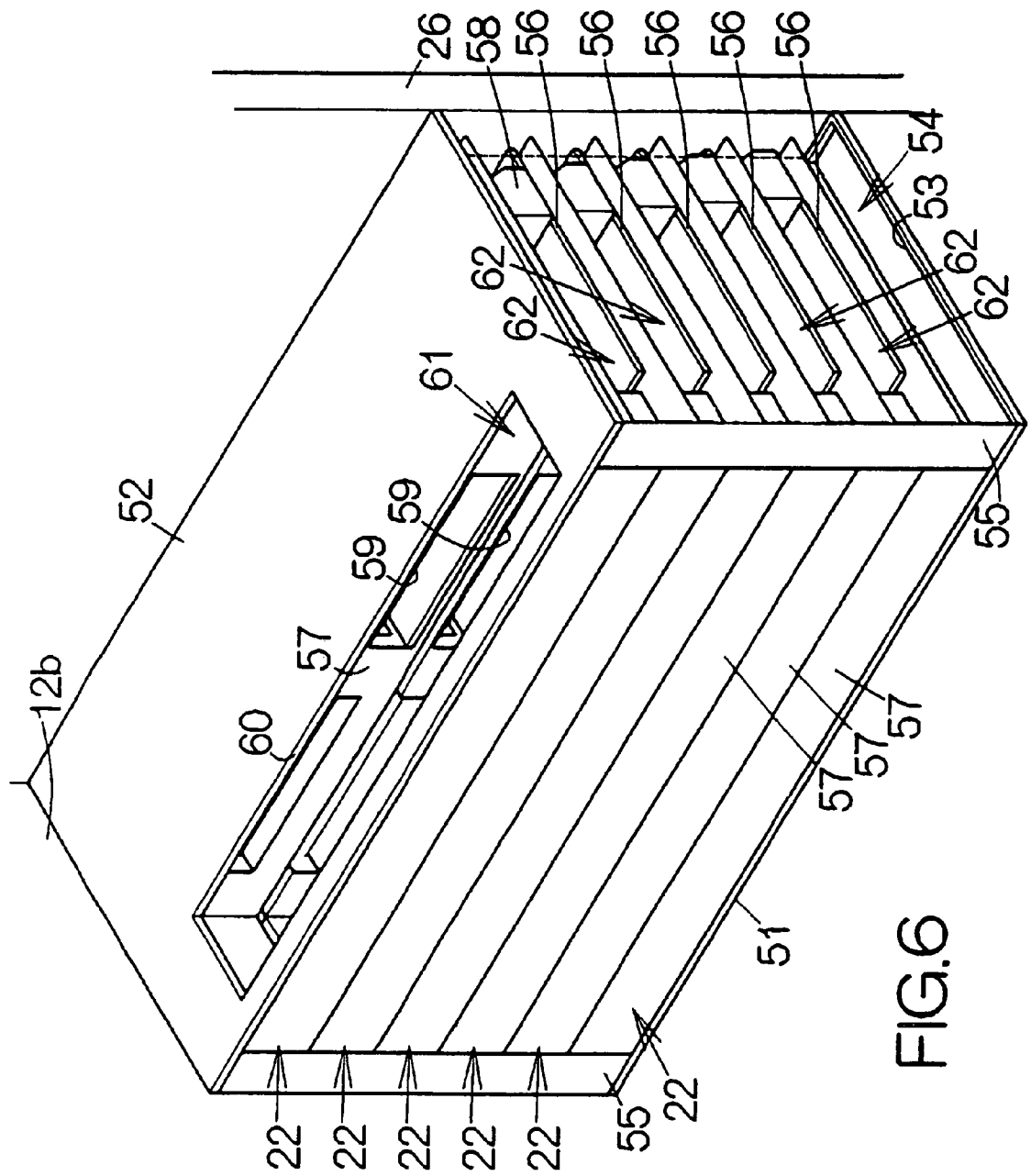
FIG. 6 is a perspective view schematically illustrating the structure of a second electronic component unit.

As shown in FIG. 6, the second electronic component units 22 are placed in a space between third and fourth partition boards 51, 52. The third partition board 51 supports the lowest one of the second electronic component units 22. The fourth partition board 52 covers over the uppermost one of the second electronic component units 22. The third partition board 51 is opposed to the uppermost one of the first electronic component units 21. The fourth partition board 52 is opposed to the lowest one of the second fan units 23.

Air inlets 53 are formed in the third partition board 51 between the outer periphery of the lowest one of the second electronic component units 22 and the side panels 12b. A right duct 54 and a left duct are defined between the second electronic component units 22 and the side panels 12b, respectively. The right duct 54 and the left duct extend in the vertical direction from the air inlets 53, respectively. The right duct 54 and the left duct extend in parallel with the aforementioned duct 27. The side panels 12b, the back panel 26, wall members 55 and the fourth partition board 52 in combination serve to define the right duct 54 and the left duct, respectively. The wall members 55 extend from the front edge of the third partition board 51 to the front edge of the fourth partition board 52 in a space between the second electronic component units 22 and the side panels 12b.

The individual second electronic component unit 22 includes a printed wiring board 56 in the shape of a rectangle extending in the horizontal direction. The rear edge of the printed wiring board 56 is coupled to the back panel 26 at one of the sides of the rectangle. A duct 57 extends in the vertical direction along the front edge of the printed wiring board 56 in a space outside the printed wiring board 56. The uppermost one of the second electronic component units 22 allows the upper end of the duct 57 to be coupled to an air outlet 60 formed in the fourth partition board 52. A rear panel 58 stands upright in the vertical direction from the printed wiring board 56 at the rear edge of the printed wiring board 56.

The duct 57 extends in the lateral direction of the second electronic component unit 22 along the front edge of the printed wiring board 56. An opening 59 is formed in the duct 57 along the surface of the printed wiring board 56. The ducts 57, 57 of the adjacent ones of the second electronic component units 22 are coupled to each other. The ducts 57 of the second electronic component units 22 are thus arranged in six tiers in the vertical direction. This results in establishment of a vertical duct 61 extending in the vertical direction.

Figure 7:
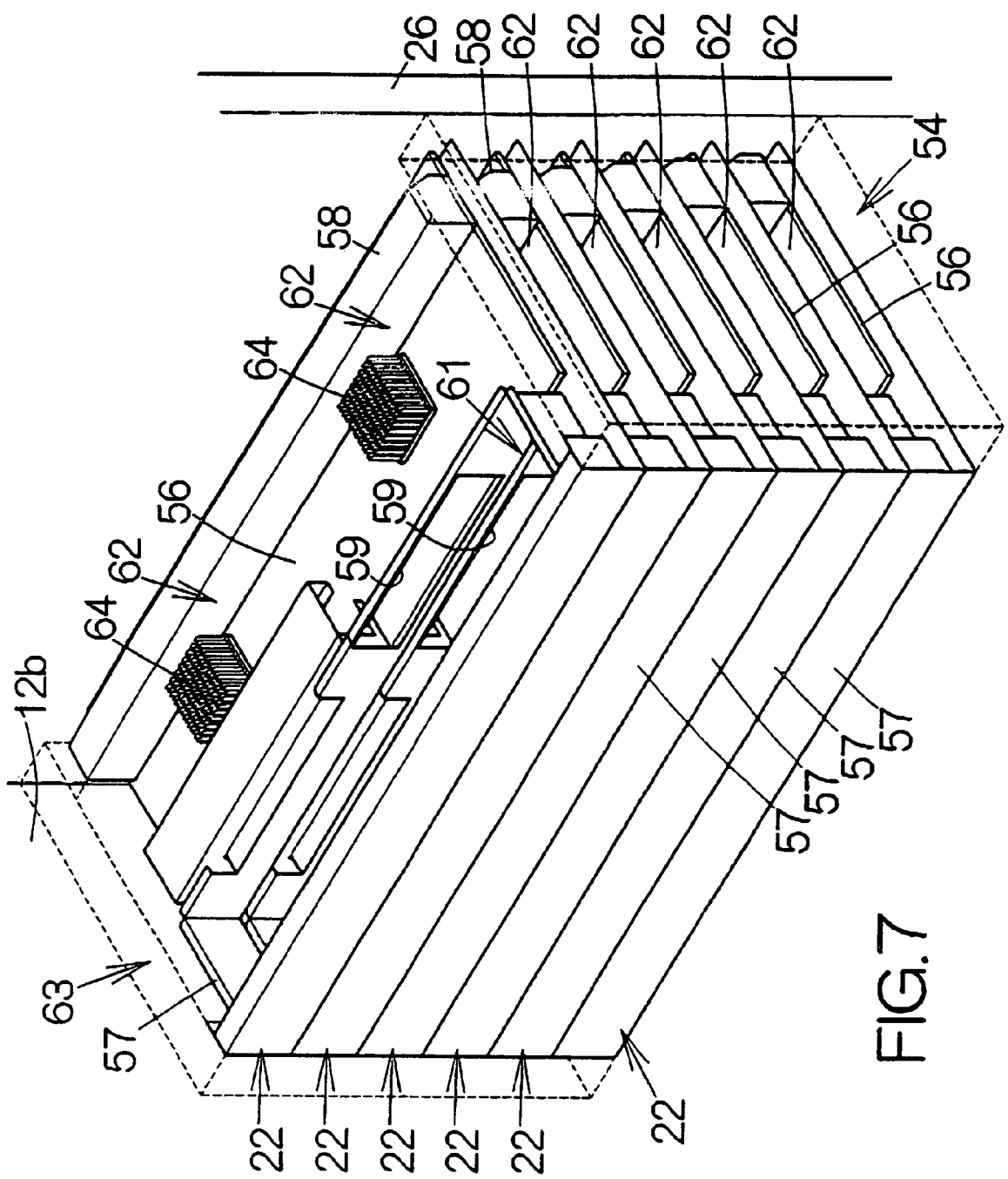
FIG. 7 is a perspective view schematically illustrating the structure of the second electronic component unit.

A horizontal duct 62 is defined between the duct 57 and the rear panel 58 in a space between the adjacent ones of the printed wiring boards 56. The uppermost one of the horizontal ducts 62 is defined between the printed wiring board 56 and the fourth partition board 52. Referring also to FIG. 7, the horizontal ducts 62 extend in the horizontal direction between the right duct 54 and the vertical duct 61 as well as between the left duct 63 and the vertical duct 61.

LSI packages 64, 64 are mounted on the individual printed wiring board 56, for example. A controller chip is embedded in the individual LSI package 64, for example. The controller chip functions as a crossbar switch for data transferred between the CPUs on the system boards 28 or between the CPUs and the input/output units 13, for example. The system boards 28 in the upright attitudes are arranged in the horizontal direction along the surface of the back panel 26 as described above. The printed wiring board 56 in the individual second electronic component unit 22 thus intersects all the system boards 28 along the back surface of the back panel 26. The individual printed wiring board 56 serves to establish an electric connection between the system boards 28.

Here, the pressure loss of the horizontal duct 62 located at a downstream position in the right and left ducts 54, 63 is set larger than that of the horizontal duct 62 located at an upstream position. In this case, the cross section of the horizontal duct 62 at a downstream position or an upper position may be narrower than that of the horizontal duct 62 at an upstream position or a lower position. Alternatively, the opening 59 of the horizontal duct 62 at an upper position may be narrower than the opening 59 of the horizontal duct 62 at a lower position.

Such an increase in the pressure loss in the downstream direction results in a reduction in the amount of airflow running through the horizontal duct 62 at a downstream position. The horizontal duct 62 at an upstream position is correspondingly allowed to enjoy an increase in the amount of airflow. In this manner, all the horizontal ducts 62 are allowed to enjoy a sufficient amount of airflow. The airflow of a sufficient amount runs through all of the horizontal ducts 62. The second electronic component units 22 can evenly be cooled.

Figure 8:
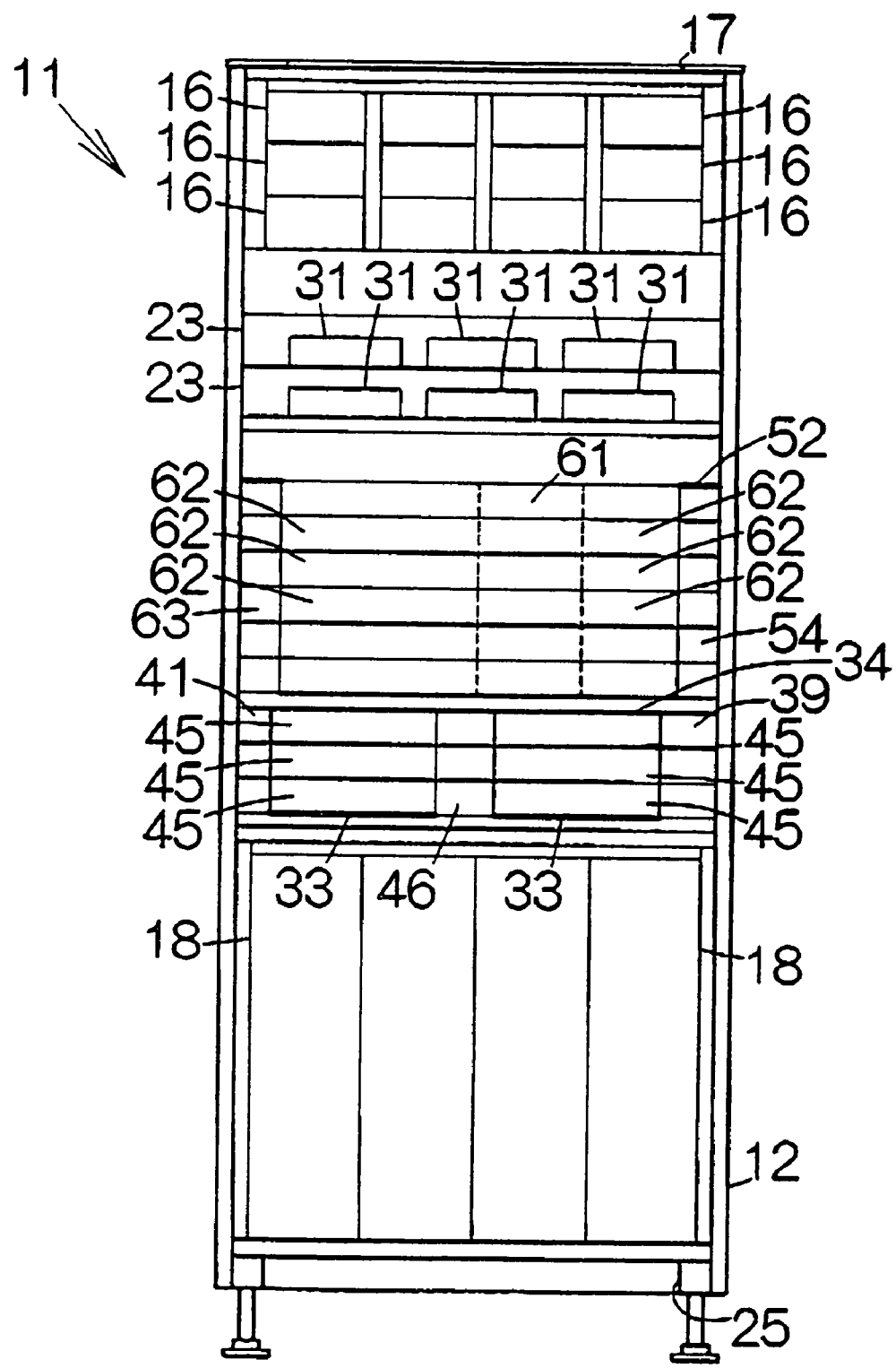
FIG. 8 is a front plan view schematically illustrating the inner structure of the server computer.

As shown in FIG. 8, the upper ends of the input/output units 18 are connected to the central duct 46, the right duct 39 and the left duct 41. The central duct 46, the right duct 39 and the left duct 41 are connected to the horizontal ducts 45. The second partition board 34 serves to define the closed upper end of the central duct 46. The right duct 39 is connected to the right duct 54. The left duct 41 is connected to the left duct 63.

The vertical duct 61 is connected to the second axial flow fans 31 at the upper end of the vertical duct 61. The fourth partition board 52 serves to define the closed upper end of the right duct 54. The fourth partition board 52 likewise serves to define the closed upper end of the left duct 63. The horizontal ducts 62 serve to connect the right duct 54 and the left duct 63 to the vertical duct 61.

Figure 9:
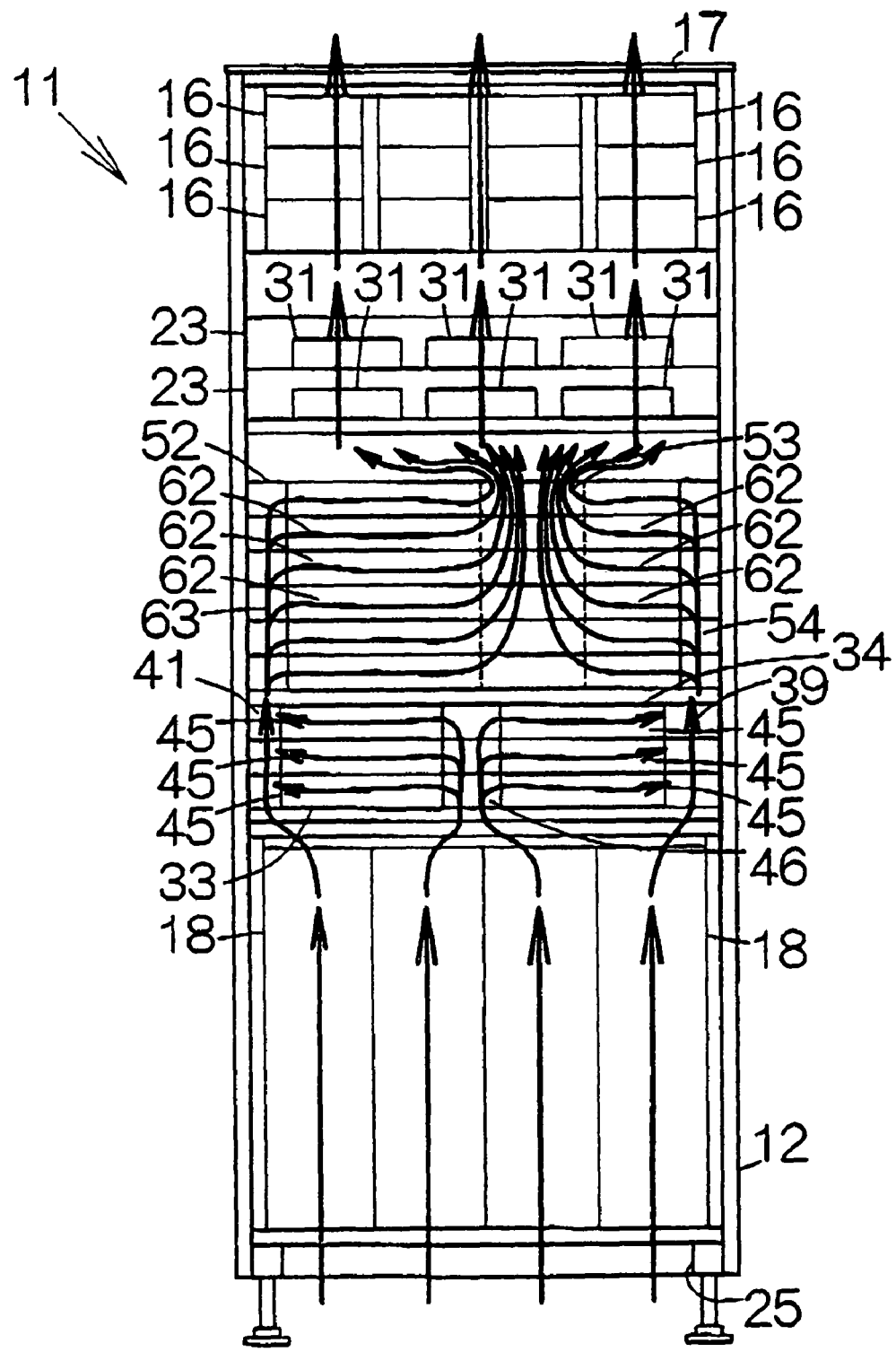
FIG. 9 is a front plan view schematically illustrating the path of airflow.

Now, assume that the second axial flow fans 31 of the individual second fan unit 23 generate airflow in the enclosure 12. The rotation of the rotor of the individual second axial flow fan 31 allows a fresh air to enter the air intake opening 25. As shown in FIG. 9, the airflow runs in the vertical direction within the input/output units 18. The airflow absorbs heat from the PCI boards, for example. The PCI boards are thus prevented from a rise in temperature.

Figure 10:
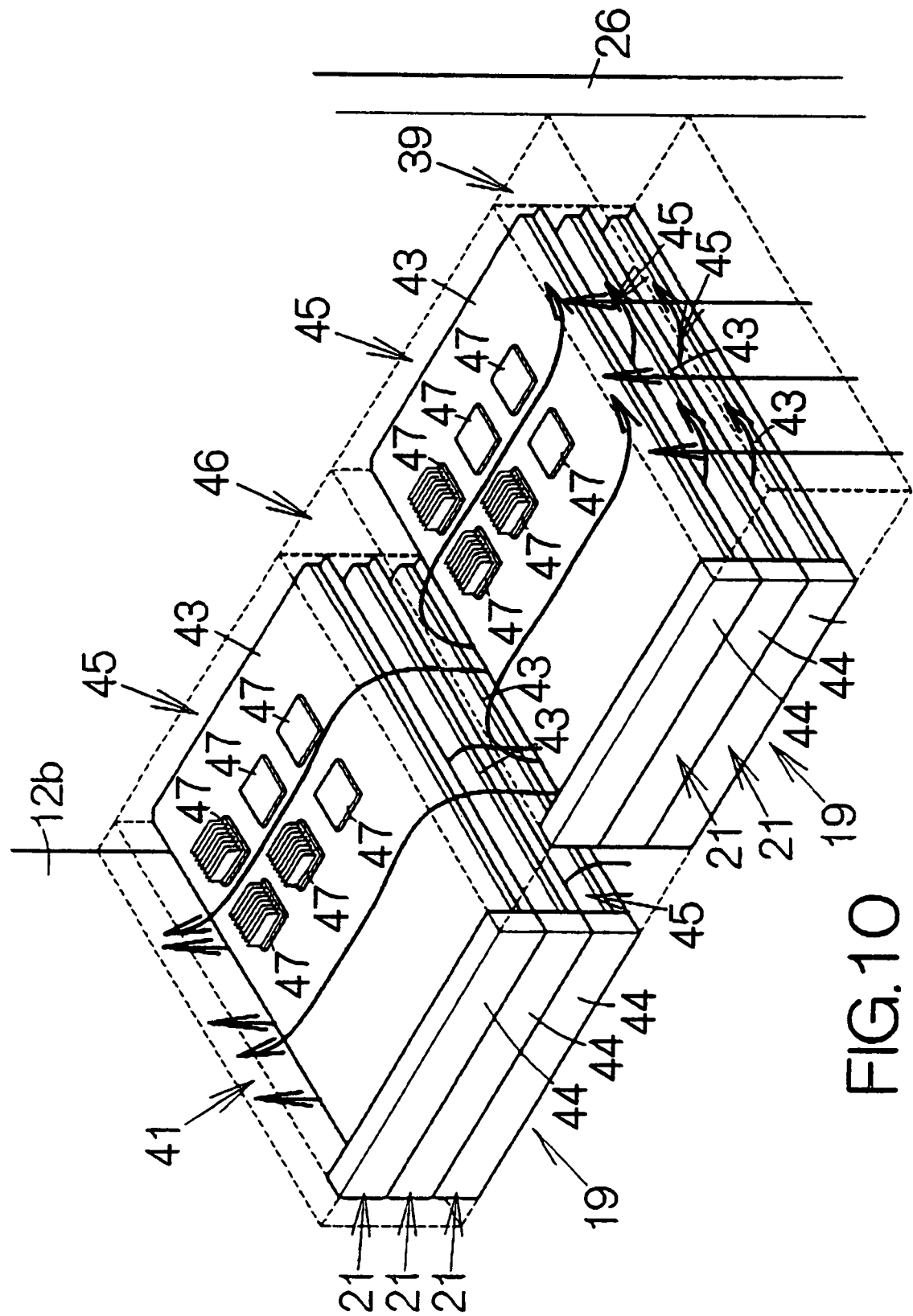
FIG. 10 is a perspective view schematically illustrating the path of airflow.

Referring also to FIG. 10, the airflow is allowed to flow into the central duct 46 through the opening of the first partition board 33. Since the second partition board 34 closes the upper end of the central duct 46, the airflow is allowed to run into the horizontal ducts 45 from the central duct 46. The airflow thus runs along the surfaces of the printed wiring boards 43. The airflow absorbs heat from the LSI packages 47. The CPU chips are thus prevented from a rise in temperature.

Likewise, the airflow is allowed to flow into the right and left ducts 39, 41 through the air inlets 37, 37 of the first partition board 33. The airflow is allowed to run into the right and left ducts 39, 41 from the horizontal ducts 45. The airflow runs in the vertical direction from the air inlets 37 to the air outlets 38 in the right and left ducts 39, 41. The airflow is discharged through the air outlets 38 of the second partition board 34.

Figure 11:
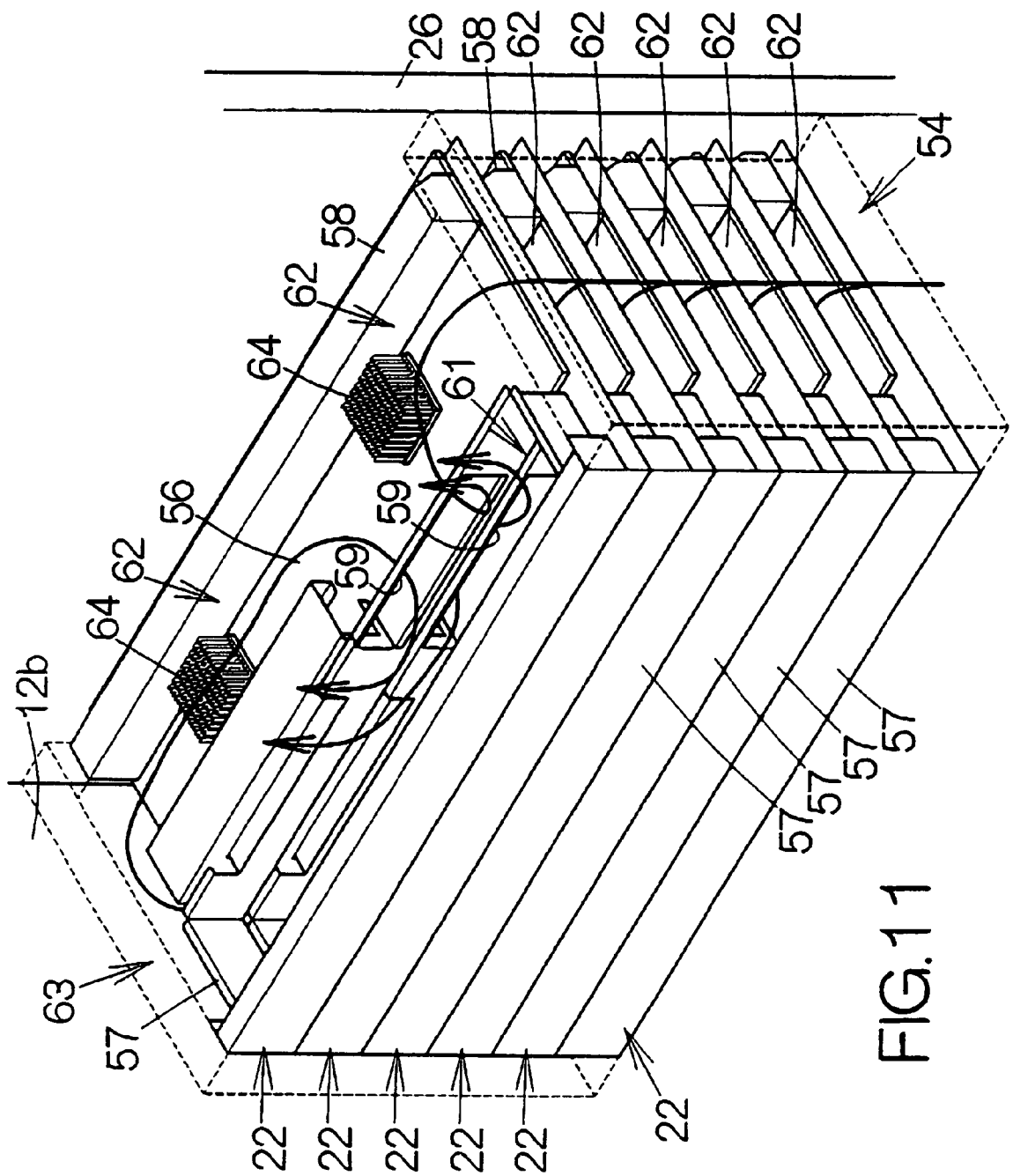
FIG. 11 is a perspective view schematically illustrating the path of airflow.

The airflow is then allowed to flow into the right and left ducts 54, 63. The airflow runs in the vertical direction within the right and left ducts 54, 63. Since the fourth partition board 52 closes the upper ends of the right and left ducts 54, 63, the airflow is allowed to run into the horizontal ducts 62 from the right and left ducts 54, 63. Referring also to FIG. 11, the airflow runs along the surfaces of the printed wiring boards 56. The air flow absorbs heat from the LSI packages 64. The controller chips are thus prevented from a rise in temperature.

The airflow running in the horizontal ducts 62 is then allowed to flow into the ducts 57, namely the vertical duct 61, through the openings 59. Since the upper end of the vertical duct 61 is connected to the second axial flow fans 31, the airflow runs in the vertical direction within the vertical duct 61. The airflow thus runs from the vertical duct 61 to the second axial flow fans 31. The airflow is then discharged through the air discharge opening 17.

The server computer 11 allows the system boards 28 to establish the upright or vertical attitudes within the duct 27 extending in the vertical direction. The first axial flow fans 29 generate airflow running in the vertical direction within the duct 27. The airflow absorbs heat from the system boards 28 within the duct 27. The printed wiring boards 43, 56 take the horizontal attitudes within the horizontal ducts 45, 62. The horizontal ducts 45, 62 are connected to the central duct 46, the right and left ducts 39, 41, the right and left ducts 54, 63, the vertical ducts 61, all extending in parallel with the duct 27. The vertical duct 61 is connected to the second axial flow fans 31. The second axial flow fans 31 generate airflow running in the vertical direction. The airflow absorbs heat from the printed wiring boards 43, 56 within the horizontal ducts 45, 62. The airflow is allowed to efficiently run within the enclosure 12 in this manner.

The airflow runs in the vertical direction when the airflow is guided into the horizontal ducts 45, 62. The enclosure 11 or the server computer 11 is allowed to have a reduced extent in the horizontal direction as compared with the case where axial flow fans having rotors rotating around the horizontal axes serve to generate horizontal airflow in the horizontal ducts 45, 62. The server computer 11 is in this manner allowed to enjoy a reduced size. In addition, the first and second axial flow fans 29, 31 can be arranged along a specific horizontal plane in a packed manner in the enclosure 12. This results in simplification of the wiring structure of the first and second axial flow fans 29, 31, for example.

What is claimed is:

1. An electronic component unit detachably mounted in an electronic apparatus, the electronic component unit comprising:

a printed wiring board;
an electronic component mounted on a surface of the printed wiring board;
a duct lying adjacent to an outer periphery of the printed wiring board at a position outside the printed wiring board, the duct extending in a direction perpendicular to the surface of the printed wiring board so as to allow airflow to flow in the direction perpendicular to the surface of the printed wiring board;
an opening formed in the duct along the surface of the printed wiring board;
a rear panel standing on the surface of the printed wiring board at a rear edge of the printed wiring board opposite to the outer periphery adjacent to the duct; and
a further duct defined between the rear panel and the duct so as to extend in a horizontal direction, wherein
the duct is coupled to a duct of an other electronic component unit when the electronic component unit is mounted in the electronic apparatus.

2. An electronic apparatus comprising:
an enclosure; and
a plurality of electronic component units enclosed in the enclosure, the electronic component units being arranged in a vertical direction in the enclosure, wherein
each of the electronic component units includes:
a printed wiring board;
an electronic component mounted on a surface of the printed wiring board;
a duct lying adjacent to an outer periphery of the printed wiring board at a position outside the printed wiring board, the duct extending in the vertical direction perpendicular to the surface of the printed wiring board; and
an opening formed in a wall of the duct, the opening provided along the surface of the printed wiring board;
a rear panel standing on the surface of the printed wiring board at a rear edge of the printed wiring board opposite to the outer periphery adjacent to the duct; and
a further duct defined between the rear panel and the duct so as to extend in a horizontal direction, further wherein
the ducts of electronic component units are coupled to each other in the vertical direction so as to form a single duct in the enclosure.

3. An electronic component unit comprising:
a sole printed wiring board;
an electronic component mounted on a surface of the printed wiring board; and
a sole duct lying adjacent to an outer periphery of the printed wiring board at a position outside the printed wiring board, the duct extending in a direction perpendicular to the surface of the printed wiring board, the duct having an opening at a lower end of the duct along a plane including the printed wiring board.

* * * * *